(12) United States Patent
Nandakumar et al.

(10) Patent No.: US 10,276,684 B2
(45) Date of Patent: *Apr. 30, 2019

(54) CONDUCTIVE SPLINE FOR METAL GATES

(71) Applicant: Texas Instruments Incorporated, Dallas, TX (US)

(72) Inventors: Mahalingam Nandakumar, Richardson, TX (US); Steve Lytle, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 83 days.

This patent is subject to a terminal disclaimer.

(21) Appl. No.: 15/372,512

(22) Filed: Dec. 8, 2016

(65) Prior Publication Data

US 2017/0092731 A1    Mar. 30, 2017

Related U.S. Application Data

(63) Continuation of application No. 14/282,600, filed on May 20, 2014, now Pat. No. 9,548,384.

(51) Int. Cl.
| | |
|---|---|
| *H01L 29/49* | (2006.01) |
| *H01L 29/78* | (2006.01) |
| *H01L 21/762* | (2006.01) |
| *H01L 29/66* | (2006.01) |
| *H01L 21/768* | (2006.01) |
| *H01L 23/485* | (2006.01) |
| *H01L 23/528* | (2006.01) |
| *H01L 27/088* | (2006.01) |
| *H01L 29/06* | (2006.01) |

(52) U.S. Cl.
 CPC ........ *H01L 29/4966* (2013.01); *H01L 21/762* (2013.01); *H01L 21/76224* (2013.01); *H01L 21/76895* (2013.01); *H01L 23/485* (2013.01); *H01L 23/528* (2013.01); *H01L 27/0886* (2013.01); *H01L 29/0649* (2013.01); *H01L 29/66545* (2013.01); *H01L 29/78* (2013.01); *H01L 2924/0002* (2013.01)

(58) Field of Classification Search
 CPC ............... H01L 29/4966; H01L 21/762; H01L 21/76224; H01L 21/76895; H01L 23/485; H01L 23/528; H01L 27/0886; H01L 29/0649; H01L 29/66545; H01L 29/78; H01L 2924/0002; H01L 29/66477; H01L 29/66
 USPC ................................................. 257/401, 415
 See application file for complete search history.

(56) References Cited

U.S. PATENT DOCUMENTS

| | | |
|---|---|---|
| 4,377,857 A | 3/1983 | Tickle |
| 6,660,588 B1 | 12/2003 | Yang et al. |
| 9,548,384 B2 * | 1/2017 | Nandakumar .......... H01L 29/78 |
| 2008/0099824 A1 | 5/2008 | Oh |

* cited by examiner

*Primary Examiner* — Hrayr A Sayadian
(74) *Attorney, Agent, or Firm* — Rose Alyssa Keagy; Charles A. Brill; Frank D. Cimino

(57) ABSTRACT

An integrated circuit may include a metal gate which extends over an active area and onto an isolation dielectric layer. A conductive spline is formed on the metal gate, extending on the metal gate over at least a portion of the isolation dielectric layer, and extending on the metal gate for a length at least four times a width of the metal gate.

20 Claims, 18 Drawing Sheets

CONDUCTIVE SPLINE FOR METAL GATES

CROSS-REFERENCE TO RELATED APPLICATIONS

Under 35 U.S.C. § 120, this continuation application claims benefits of and priority to U.S. patent application Ser. No. 14/282,600, filed on May 20, 2014, the entirety of which are hereby incorporated herein by reference.

FIELD

This disclosure relates to the field of integrated circuits. More particularly, this disclosure relates to metal gates in integrated circuits.

BACKGROUND

An integrated circuit may include metal gates with widths less than 30 nanometers. The metal gates may have work function layers and barriers of high electrical resistivity materials such as refractory metals. As a result, the electrical resistance per unit length of the metal gates may be undesirably high. Debiasing along the metals gates may occur in high frequency components and along metal gates used as local interconnects. Designing the integrated circuit to avoid metal gate debiasing may be problematic.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit may include a metal gate which extends over an active area and onto an isolation dielectric layer. A conductive spline is formed on the metal gate, extending on the metal gate over at least a portion of the isolation dielectric layer, and extending on the metal gate for a length at least four times a width of the metal gate.

DETAILED DESCRIPTION

The following application contains related material and is hereby incorporated in its entirety: U.S. patent application Ser. No. 14/282,538 entitled "SHUNT OF P-GATE TO N-GATE BOUNDARY RESISTANCE FOR METAL GATE TECHNOLOGIES" filed concurrently with this application.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An integrated circuit may include a metal gate which extends over an active area and onto an isolation dielectric layer. A conductive spline is formed on the metal gate, extending on the metal gate over at least a portion of the isolation dielectric layer, and extending on the metal gate for a length at least four times a width of the metal gate.

Figure 1:
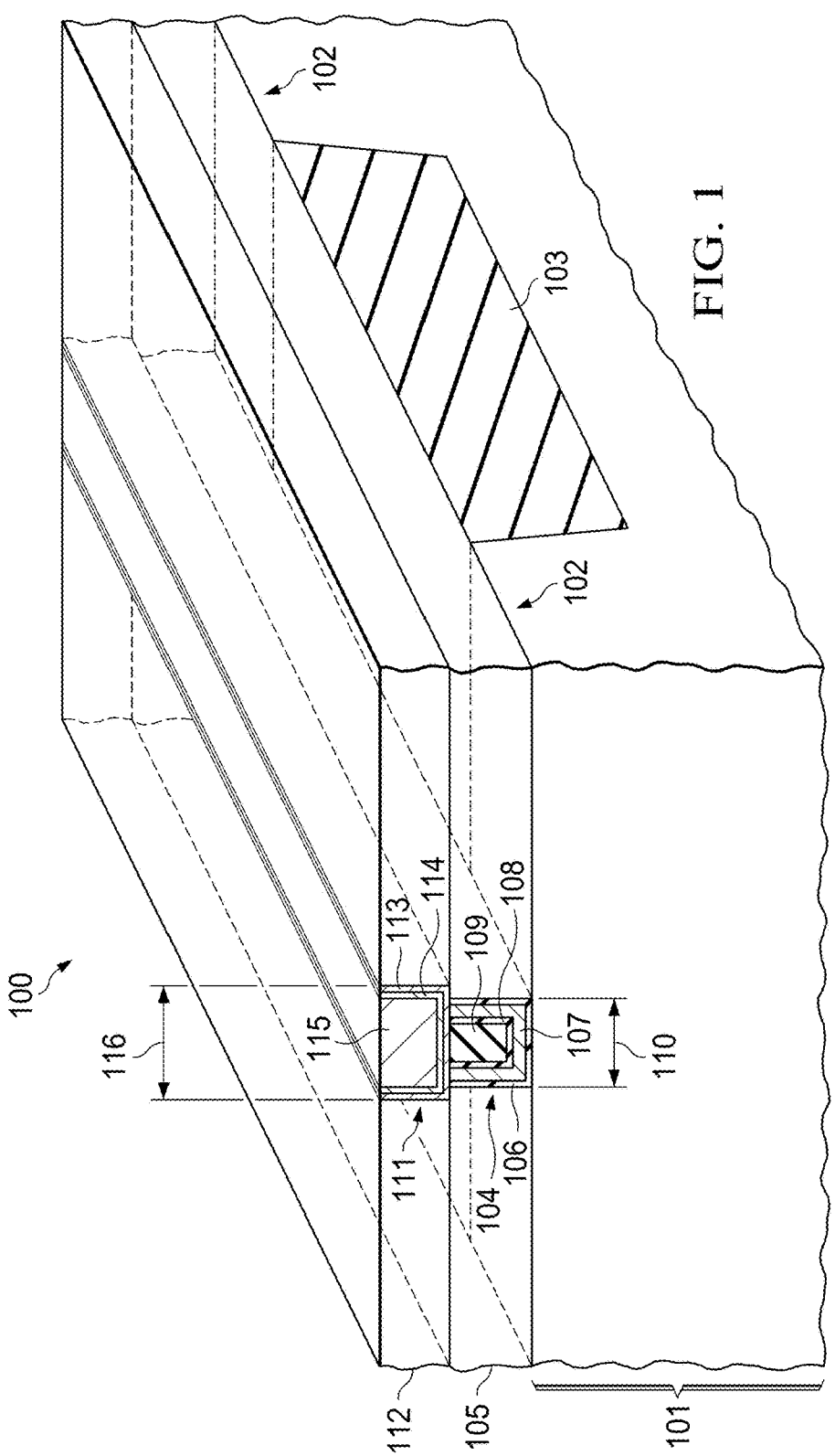
FIG. 1 is a cross section of an exemplary integrated circuit.

FIG. 1 is a cross section of an exemplary integrated circuit. The integrated circuit 100 is formed on a substrate 101, which may be, for example, a silicon wafer, a silicon-on-insulator (SOI) wafer, a semiconductor wafer containing silicon-germanium epitaxial regions, a gallium arsenide wafer, or other substrate suitable for forming the integrated circuit 100. Active areas 102 at a top surface of the substrate 101 are separated by an isolation dielectric layer 103. The isolation dielectric layer 103 may be, for example, field oxide formed by a shallow trench isolation (STI) process.

A metal gate 104 is formed over the substrate 101, extending over at least a portion of one of the active areas 102 and over at least a portion of the isolation dielectric layer 103. The metal gate 104 may be formed, for example, in a lower dielectric layer 105, possibly by a metal replacement gate process. The metal gate 104 may include, for example, a high-k gate dielectric layer 106, a work function layer 107 formed on the high-k gate dielectric layer 106, a barrier layer 108 formed on the work function layer 107, and a fill metal 109 formed on the barrier layer 108. A width 110 of the metal gate 104 may be, for example, less than 30 nanometers.

A conductive spline 111 is formed on the metal gate 104, extending on the metal gate 104 over at least a portion of the isolation dielectric layer 103. The conductive spline 111 extends on the metal gate 104 for a length at least four times the width 110 of the metal gate 104. The conductive spline 111 may be formed, for example, in a lower pre-metal dielectric (PMD) layer 112 which is formed on the lower dielectric layer 105. In one version of the instant example, the conductive spline 111 may be formed by a damascene process. The conductive spline 111 may include an adhesion layer 113, for example 5 nanometers to 15 nanometers of titanium, which contacts the metal gate 104 and the lower PMD layer 112. The conductive spline 111 may further include a barrier layer 114, for example 10 nanometers to 20 nanometers of titanium nitride, formed on the adhesion layer 113. The conductive spline 111 may also include a fill metal 115, for example tungsten, aluminum, cobalt-aluminum alloy or copper, formed on the barrier layer 114. In an alternate version, the conductive spline 111 may be formed by etching a layer of metal deposited on the metal gate 104 and the lower dielectric layer 105 before the lower PMD layer 112 is formed. The conductive spline 111 advantageously reduces debiasing of signals along the metal gate 104. In one version of the instant example, a width 116 of the conductive spline 111 may be, for example, 10 percent to 50 percent greater than the width 110 of the metal gate 104, as depicted in FIG. 1. In another version, the width 116 of the conductive spline 111 may be substantially equal to the width 110 of the metal gate 104. In the instant example, a top surface of the conductive spline 111 is substantially coplanar with a top surface of the lower PMD layer 112, advantageously enabling routing interconnects in a first metal level over the conductive spline 111, so as to desirably reduce a size of the integrated circuit 100.

Figure 2:
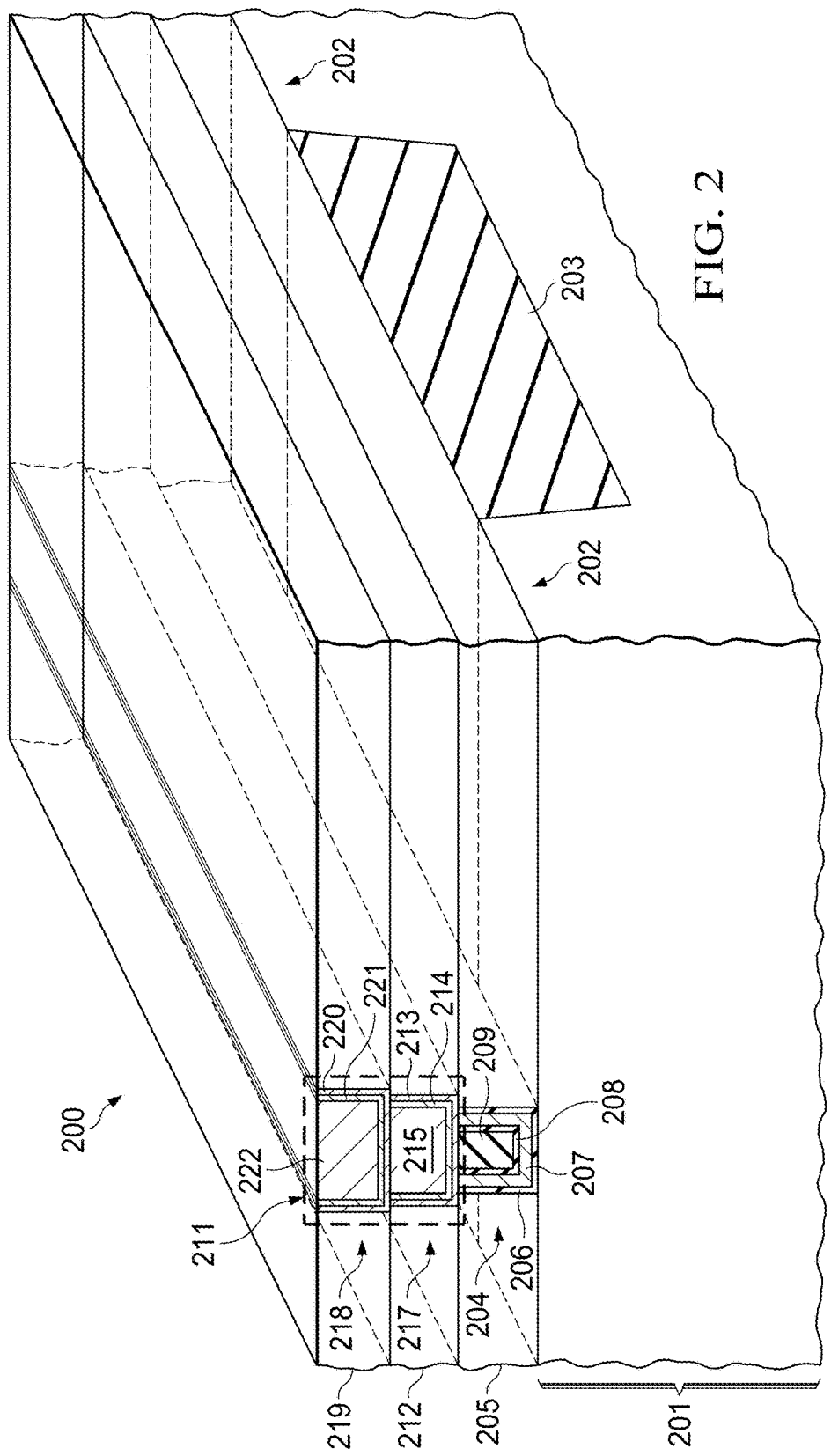
FIG. 2 is a cross section of another exemplary integrated circuit.

FIG. 2 is a cross section of another exemplary integrated circuit. The integrated circuit 200 is formed on a substrate 201, for example as described in reference to FIG. 1. Active areas 202 at a top surface of the substrate 201 are separated by an isolation dielectric layer 203. A metal gate 204 is formed over the substrate 201, extending over at least a portion of one of the active areas 202 and over at least a portion of the isolation dielectric layer 203. The metal gate 204 may be formed in a lower dielectric layer 205, and may include a high-k gate dielectric layer 206, a work function layer 207, a barrier layer 208, and a fill metal 209.

A conductive spline 211 is formed on the metal gate 204, extending on the metal gate 204 over at least a portion of the isolation dielectric layer 203. The conductive spline 211 extends on the metal gate 204 for a length at least four times a width of the metal gate 204. In the instant example, the conductive spline 211 includes a first spline level 217 in a lower PMD layer 212 and a second spline level 218 in an upper PMD layer 219.

The first spline level 217 may be formed, for example, by a damascene process, and include an adhesion layer 213, a barrier layer 214, and a fill metal 215. In an alternate version, the first spline level 217 may be formed by etching a layer of metal deposited on the metal gate 204 and the lower dielectric layer 205 before the lower PMD layer 212 is formed.

The second spline level 218 may also be formed by a damascene process, and include an adhesion layer 220, a barrier layer 221, and a fill metal 222. In an alternate version, the second spline level 218 may be formed by etching a layer of metal deposited on the first spline level 217 and the lower PMD layer 212 before the upper PMD layer 219 is formed. Forming the conductive spline 211 to include the first spline level 217 and the second spline level 218 advantageously reduces debiasing of signals along the metal gate 204 more than a conductive spline consisting of a single level.

Figure 3:
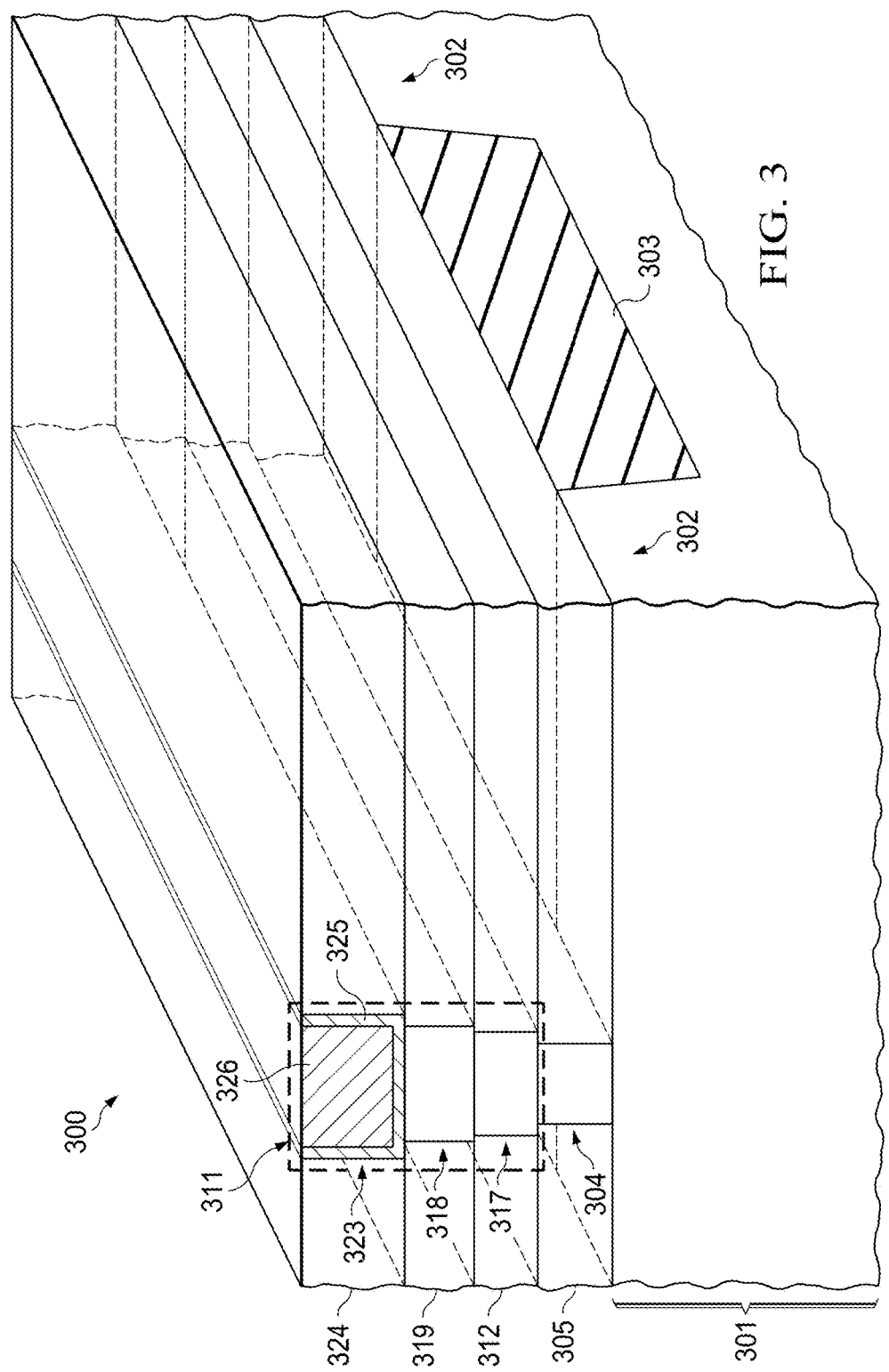
FIG. 3 is a cross section of another exemplary integrated circuit.

FIG. 3 is a cross section of another exemplary integrated circuit. The integrated circuit 300 is formed on a substrate 301, for example as described in reference to FIG. 1. Active areas 302 at a top surface of the substrate 301 are separated by an isolation dielectric layer 303. A metal gate 304 is formed over the substrate 301, extending over at least a portion of one of the active areas 302 and over at least a portion of the isolation dielectric layer 303. A conductive spline 311 is formed on the metal gate 304, extending on the metal gate 304 over at least a portion of the isolation dielectric layer 303. The conductive spline 311 extends on the metal gate 304 for a length at least four times a width of the metal gate 304. In the instant example, the conductive spline 311 includes a first spline level 317 in a lower PMD layer 312, a second spline level 318 in an upper PMD layer 319, and a third spline level 323 in an inter-metal dielectric (IMD) layer 324.

The first spline level 317 may be formed by a damascene process after the lower PMD layer 312 is formed, or by an etch process before the lower PMD layer 312 is formed. Similarly, the second spline level 318 may be formed by a damascene process after the upper PMD layer 314 is formed, or by an etch process before the upper PMD layer 314 is formed.

The third spline level 323 may also be formed by a damascene process, and include a barrier layer 325, for example 5 nanometers to 15 nanometers of tantalum nitride, and a fill metal 326, for example copper. In an alternate version, the third spline level 323 may be formed by etching a layer of metal deposited on the second spline level 318 and the upper PMD layer 319 before the IMD layer 324 is formed. Forming the conductive spline 311 to include the first spline level 317, the second spline level 318 and the third spline level 323 further advantageously reduces debiasing of signals along the metal gate 304 more than a conductive spline consisting of a two levels.

Figure 4:
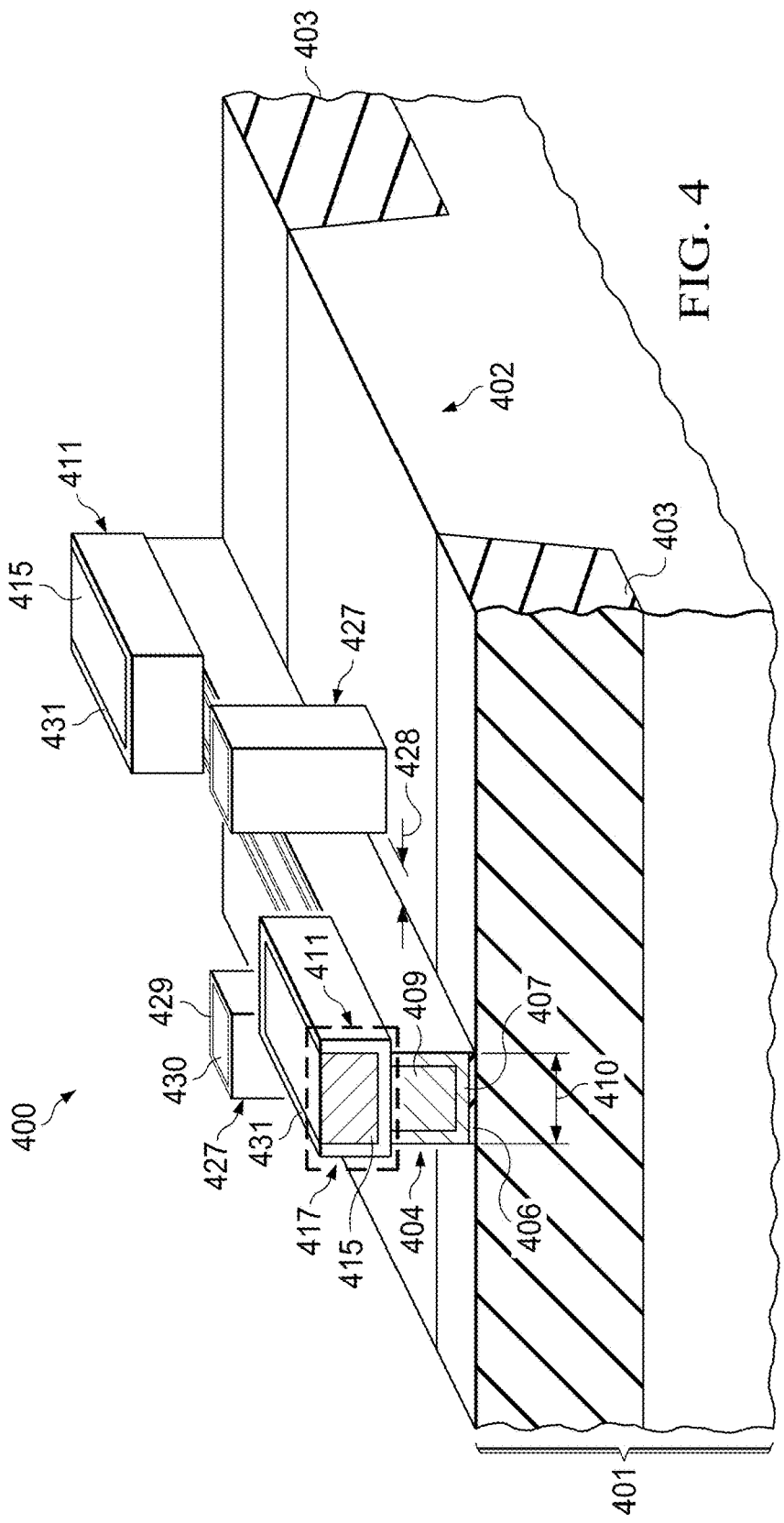
FIG. 4 is a cross section of another exemplary integrated circuit.

FIG. 4 is a cross section of another exemplary integrated circuit. The integrated circuit 400 is formed on a substrate 401, for example as described in reference to FIG. 1. An active area 402 at a top surface of the substrate 401 is bounded by an isolation dielectric layer 403. A metal gate 404 is formed over the substrate 401, extending over the active area 402 and at least a portion of the isolation dielectric layer 403. The metal gate 404 may include a high-k gate dielectric layer 406, a work function layer 407, and a fill metal 409. Other configurations of the metal gate 404 are within the scope of the instant example. A contact 427, and possibly a plurality of contacts 427, is formed on the active area 402 adjacent to the metal gate 404. In one version of the instant example, the contacts 427 may be separated from the metal gate 404 by a distance 428 that is less than a width 410 of the metal gate 404. The contacts 427 may include, for example, an adhesion layer 429, for example 10 nanometers to 20 nanometers of titanium and titanium nitride, and a fill metal 430, for example tungsten.

A conductive spline 411 is formed on the metal gate 404. The conductive spline 411 is interrupted at the contacts 427, extending on the metal gate 404 on both sides of the contacts 427. At least one portion of the conductive spline 411 extends on the metal gate 404 over at least a portion of the active area 402 and over at least a portion of the isolation dielectric layer 403. The at least one portion of the conductive spline 411 extends on the metal gate 404 for a length at least four times the width 410 of the metal gate 404. Dielectric layers, such as a lower dielectric layer abutting the metal gate 404 and a lower PMD layer abutting the conductive spline 411 have been omitted in FIG. 4 so as to more clearly show the spatial relationship of the conductive spline 411 to the contacts 427. Interrupting the conductive spline 411 at the contacts 427 may advantageously improve a process margin of forming the contacts 427 and conductive spline 411 with reduced risk of electrical shorts. Extending the conductive spline 411 on the metal gate 404 on both sides of the contacts 427 may advantageously reduce debiasing of signals along the metal gate 404.

In the instant example, the conductive spline 411 includes a first spline level 417 having an adhesion layer 431, for example titanium, tantalum, titanium nitride or tantalum nitride, and a fill metal 415, for example, tungsten, aluminum, cobalt-aluminum alloy, or copper. In alternate versions of the instant example, the conductive spline 411 may include a first spline and a second spline, as described in reference to FIG. 2, or a first spline, a second spline, and a third spline, as described in reference to FIG. 3.

Figure 5:
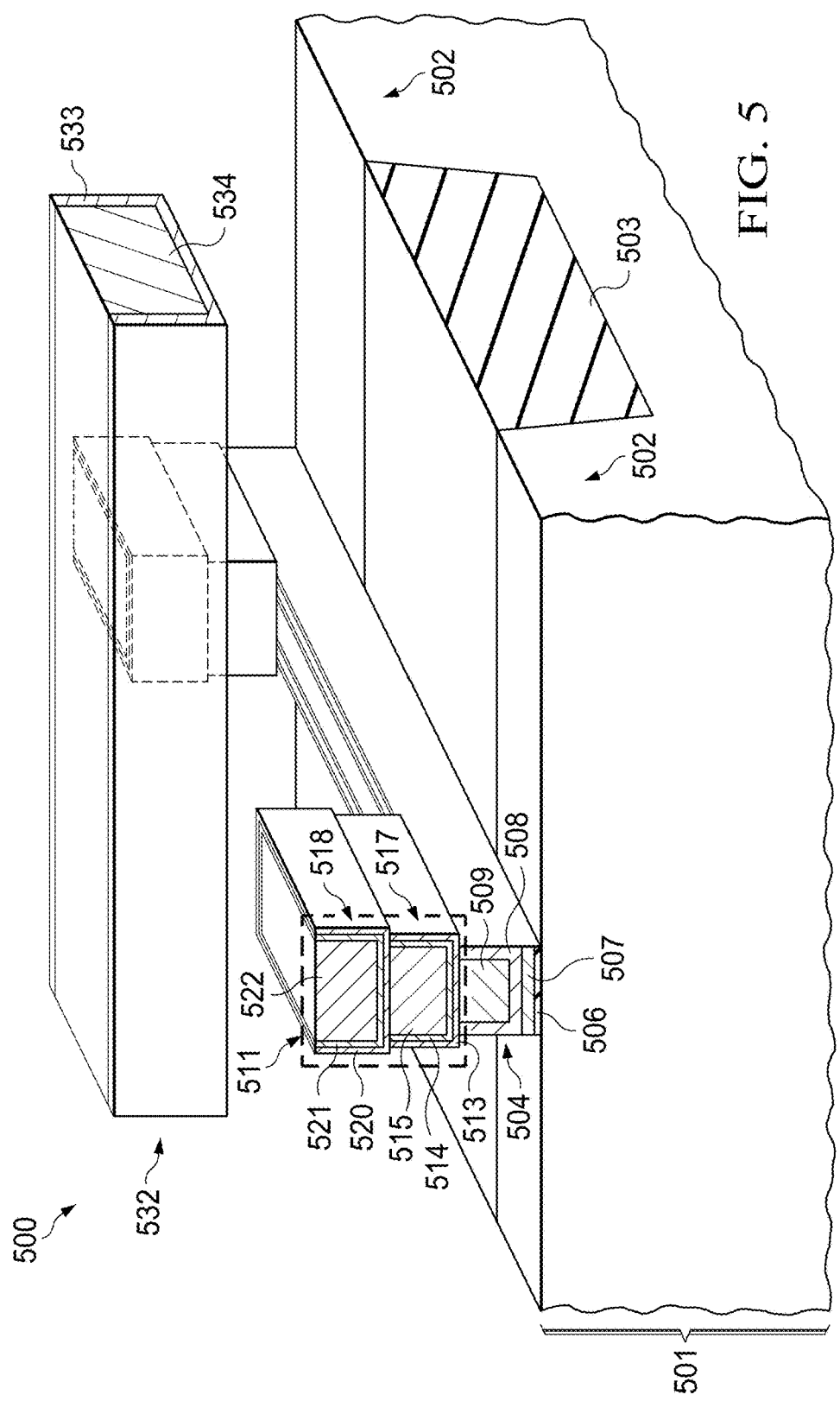
FIG. 5 is a cross section of another exemplary integrated circuit.

FIG. 5 is a cross section of another exemplary integrated circuit. The integrated circuit 500 is formed on a substrate 501, for example as described in reference to FIG. 1. Active areas 502 at a top surface of the substrate 501 are separated by an isolation dielectric layer 503. A metal gate 504 is formed over the substrate 501, extending over at least a portion of one of the active areas 502 and over at least a portion of the isolation dielectric layer 503. The metal gate 504 may include a high-k gate dielectric layer 506, a work function layer 507, a barrier layer 508 and a fill metal 509. Other configurations of the metal gate 504 are within the scope of the instant example.

A metal interconnect 532 is formed in the integrated circuit 500, crossing above the metal gate 504 separated from the metal gate 504 by dielectric material, so as not to make electrical direct contact with the metal gate 504. The dielectric material separating the metal interconnect 532 from the metal gate 504 may include, for example, a lower PMD layer and an upper PMD layer. The metal interconnect 532 may include a metal liner 533, for example 5 nanometers to 15 nanometers of tantalum nitride, and a fill metal 534, for example copper.

A conductive spline 511 is formed on the metal gate 504, extending on the metal gate 504 over at least a portion of the isolation dielectric layer 503. The conductive spline 511 is interrupted at the metal interconnect 532, extending on the metal gate 504 on both sides of the metal interconnect 532. At least one portion of the conductive spline 511 extends on the metal gate 504 over at least a portion of the isolation dielectric layer 503. The at least one portion of the conductive spline 511 extends on the metal gate 504 for a length at least four times a width of the metal gate 504. In the instant example, the conductive spline 511 includes a first spline level 517 and a second spline level 518. The first spline level 517 may be formed, for example, by a damascene process, and include an adhesion layer 513, a barrier layer 514, and a fill metal 515. The second spline level 518 may also be formed by a damascene process, and include an adhesion layer 520, a barrier layer 521, and a fill metal 522. In an alternate version, the first spline level 517 and/or the second spline level 518 may be formed by etching a layer of metal. Dielectric layers, such as a lower dielectric layer abutting the metal gate 504, the lower PMD layer, the upper PMD layer and an IMD layer abutting the metal interconnect 532 have been omitted in FIG. 5 so as to more clearly show the spatial relationship of the conductive spline 511 to the metal interconnect 532.

Interrupting the conductive spline 511 at the metal interconnect 532 may advantageously reduce debiasing of signals along the metal gate 504 while enabling efficient layout of the integrated circuit by routing the metal interconnect 532 over the metal gate 504. Extending the conductive spline 511 on the metal gate 504 on both sides of the metal interconnect 532 may advantageously reduce debiasing of signals along the metal gate 504. In alternate versions of the instant example, the conductive spline 511 may include a first spline, as described in reference to FIG. 1, or a first spline, a second spline, and a third spline, as described in reference to FIG. 3. In another version of the instant embodiment, the first spline level 517 may be continuous under the metal interconnect 532 and the second spline level 518 is interrupted at the metal interconnect 532, advantageously further reducing debiasing of signals along the metal gate 504.

Figure 6:
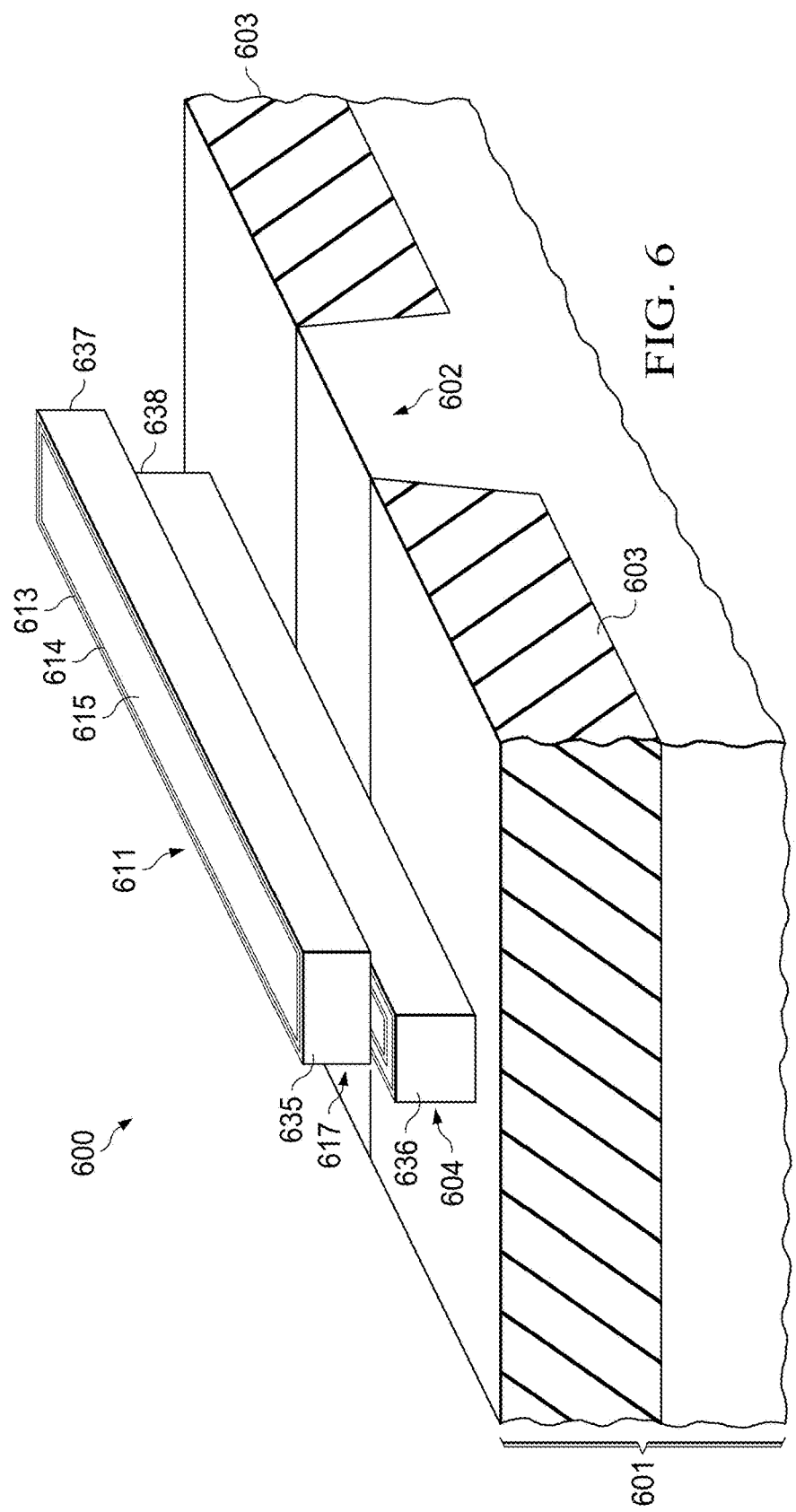
FIG. 6 is a cross section of another exemplary integrated circuit.

FIG. 6 is a cross section of another exemplary integrated circuit. The integrated circuit 600 is formed on a substrate 601, for example as described in reference to FIG. 1. An active area 602 at a top surface of the substrate 601 is bounded by an isolation dielectric layer 603. A metal gate 604 is formed over the substrate 601, extending over at least a portion of the active area 602 and over at least a portion of the isolation dielectric layer 603. The metal gate 604 may include a high-k gate dielectric layer, a work function layer, a barrier layer and a fill metal, for example as described in reference to FIG. 1. Other configurations of the metal gate 604 are within the scope of the instant example.

A conductive spline 611 is formed on the metal gate 604, extending on the metal gate 604 over at least a portion of the isolation dielectric layer 603. The conductive spline 611 extends on the metal gate 604 for a length at least four times a width of the metal gate 604. In the instant example, the conductive spline 611 may be formed suing a damascene process and may include an adhesion layer 613, a barrier layer 614 and a fill metal 615, for example as described in reference to FIG. 1. Other configurations of the conductive spline 611 are within the scope of the instant example.

A first end 635 of the conductive spline 611 may be recessed from a corresponding first end 636 of the metal gate 604 by a distance of one to two times the width of the metal gate 604. Recessing the first end 635 of the conductive spline 611 may advantageously provide greater process margin in photolithographically defining a region for the conductive spline 611 due to reduction of optical interference effects, compared to a configuration in which ends of the conductive spline 611 and the metal gate 604 are aligned within a few nanometers. Dielectric layers, such as a lower dielectric layer abutting the metal gate 604 and a lower PMD layer abutting the conductive spline 611 have been omitted in FIG. 6 so as to more clearly show the spatial relationship of the conductive spline 611 to the metal gate 604.

Independently of the configuration at the first end 635 of the conductive spline 611, a second end 637 of the conductive spline 611 may overlap a corresponding second end 638 of the metal gate 604 by a distance of one to two times the width of the metal gate 604. Overlapping the second end 637 of the conductive spline 611 may advantageously provide greater process margin in photolithographically defining a region for the conductive spline 611 as explained above and may facilitate electrical connections to the metal gate 604 through the conductive spline 611.

Figure 7:
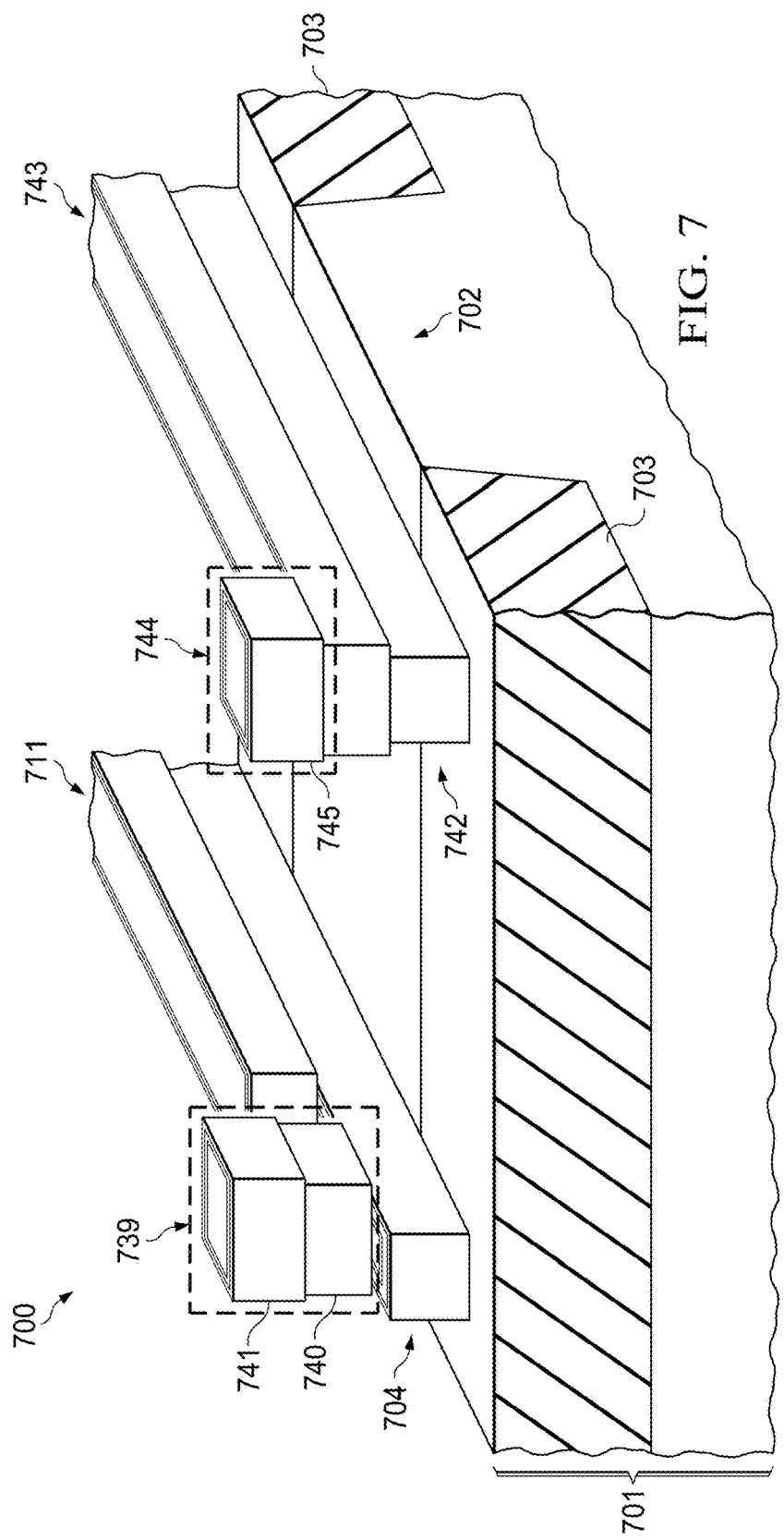
FIG. 7 is a cross section of another exemplary integrated circuit.

FIG. 7 is a cross section of another exemplary integrated circuit. The integrated circuit 700 is formed on a substrate 701, for example as described in reference to FIG. 1. An active area 702 at a top surface of the substrate 701 is bounded by an isolation dielectric layer 703.

A first metal gate 704 may be formed over the substrate 701, extending over at least a portion of the active area 702 and over at least a portion of the isolation dielectric layer 703. The first metal gate 704 may include a high-k gate dielectric layer, a work function layer, a barrier layer and a fill metal, for example as described in reference to FIG. 1. Other configurations of the first metal gate 704 are within the scope of the instant example. A first conductive spline 711 is formed on the first metal gate 704, extending on the first metal gate 704 over at least a portion of the isolation dielectric layer 703. The first conductive spline 711 extends on the first metal gate 704 for a length at least four times a width of the first metal gate 704. The first conductive spline 711 is recessed from an end of the first metal gate 704. A first contact structure 739 is formed on the first metal gate 704 proximate to the recessed end of the first conductive spline 711 so as to provide a direct electrical connection to the first metal gate 704. The first contact structure 739 may include, for example, a contact-level plug 740 and a via-level plug 741. Other configurations of the first contact structure 739 are within the scope of the instant example.

A second metal gate 742 may be formed over the substrate 701, extending over at least a portion of the isolation dielectric layer 703. A second conductive spline 743 is formed on the second metal gate 742, extending on the second metal gate 742 over at least a portion of the isolation dielectric layer 703. The second conductive spline 743 extends on the second metal gate 742 for a length at least four times a width of the second metal gate 742. A second contact structure 744 is formed on the second conductive spline 743 so as to provide an electrical connection to the second metal gate 742 through the second conductive spline 743. The second contact structure 744 may include, for example, a via-level plug 745. Other configurations of the second contact structure 744 are within the scope of the instant example. Dielectric layers, such as a lower dielectric layer abutting the metal gates 704 and 742, and a lower PMD layer abutting the conductive splines 711 and 743, have been omitted in FIG. 7 so as to more clearly show the spatial relationship of the metal gates 704 and 742, the conductive splines 711 and 743, and the contact structures 739 and 744. Forming electrical connections to metal gates with conductive splines as described in the instant example may desirably provide flexibility in a layout of the integrated circuit 700 which advantageously enables a smaller area for the layout and thus may provide a lower fabrication cost.

Figure 8:
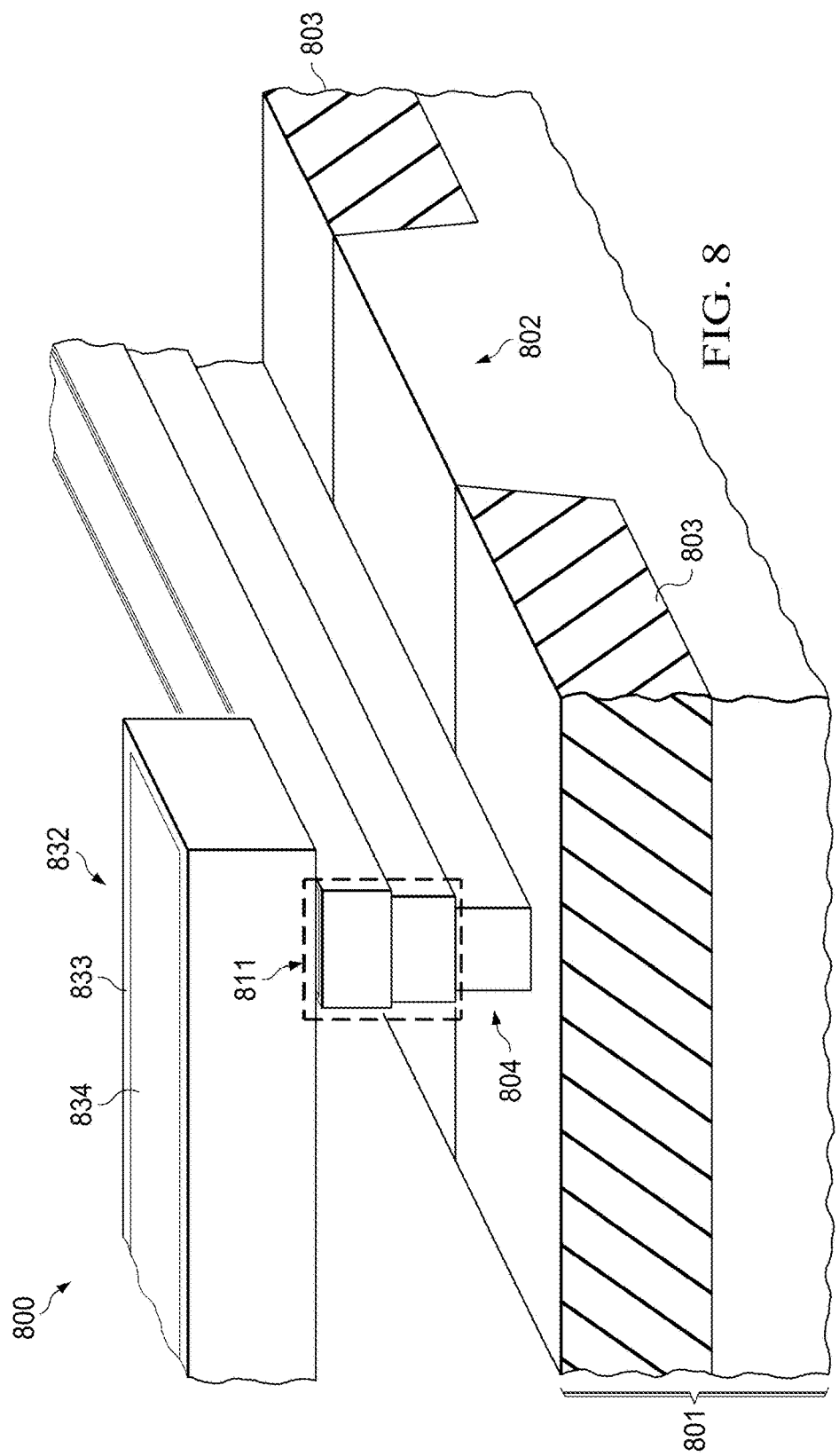
FIG. 8 is a cross section of another exemplary integrated circuit.

FIG. 8 is a cross section of another exemplary integrated circuit. The integrated circuit 800 is formed on a substrate 801, for example as described in reference to FIG. 1. An active area 802 at a top surface of the substrate 801 is bounded by an isolation dielectric layer 803. A metal gate 804 may be formed over the substrate 801, extending over at least a portion of the active area 802 and over at least a portion of the isolation dielectric layer 803. The metal gate 804 may include a high-k gate dielectric layer, a work function layer, a barrier layer and a fill metal. Other configurations of the metal gate 804 are within the scope of the instant example. A conductive spline 811 is formed on the metal gate 804, extending on the metal gate 804 over at least a portion of the isolation dielectric layer 803. The conductive spline 811 extends on the metal gate 804 for a length at least four times a width of the metal gate 804. In the instant example, the conductive spline 811 includes a first spline level 817 and a second spline level 818. The first spline level 817 may be formed, for example, by a damascene process, or by etching a layer of metal deposited on the metal gate 804. Similarly, the second spline level 818 may also be formed by a damascene process, or by etching a layer of metal deposited on the first spline level 817.

A metal interconnect 832 in a metallization level of the integrated circuit 800 is formed so as to overlap and make electrical contact to the conductive spline 811. The metal interconnect 832 may include, for example, a metal liner 833 of nanometers to 15 nanometers of tantalum nitride, and a fill metal 834 of copper. The metal interconnect 832 makes electrical connection to the metal gate 804 through the conductive spline 811. Forming the metal interconnect 832 to overlap the conductive spline 811 and thus make electrical connection to the metal gate 804 as described in the instant example may desirably provide flexibility in a layout of the integrated circuit 800 which advantageously enables a smaller area for the layout and thus may provide a lower fabrication cost.

Figure 9A:
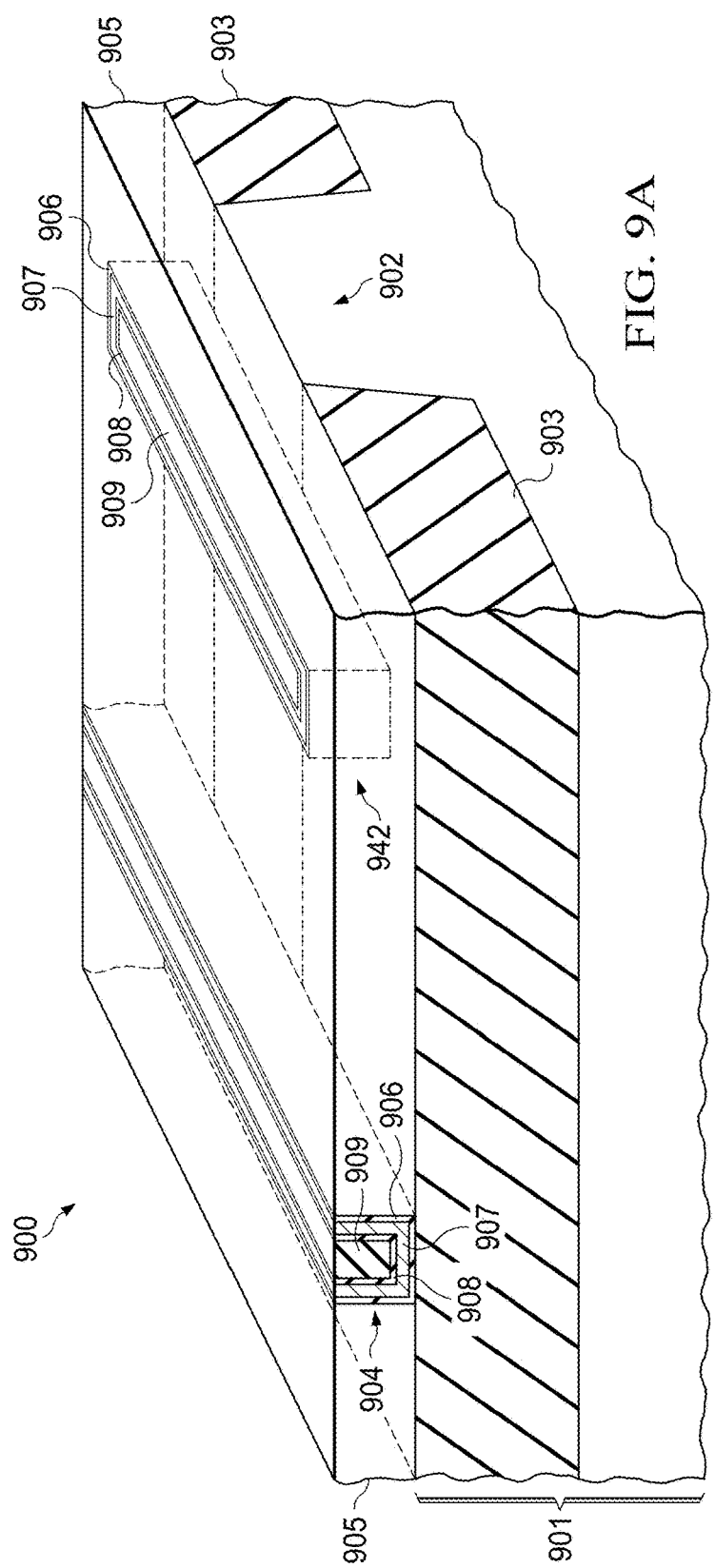
FIG. 9A through FIG. 9E are cross sections of an exemplary integrated circuit, depicted in successive stages of fabrication.

FIG. 9A through FIG. 9E are cross sections of an exemplary integrated circuit, depicted in successive stages of fabrication. Referring to FIG. 9A, the integrated circuit 900 is formed on a substrate 901, for example as described in reference to FIG. 1. An active area 902 at a top surface of the substrate 901 is bounded by an isolation dielectric layer 903. A lower dielectric layer 905 is formed over the substrate 901. The lower dielectric layer 905 may include, for example, one or more layers of silicon dioxide and/or silicon nitride, formed by plasma enhanced chemical vapor deposition (PECVD) processes.

A first metal gate 904 and a second metal gate 942 are formed on the substrate 901 through the lower dielectric layer 905. The first metal gate 904 and the second metal gate 942 may include, for example, a high-k gate dielectric layer 906, a work function layer 907 formed on the high-k gate dielectric layer 906, a barrier layer 908 formed on the work function layer 907, and a fill metal 909 formed on the barrier layer 908. Other configurations of the first metal gate 904 and the second metal gate 942 are within the scope of the instant example. The first metal gate 904 and the second metal gate 942 may be formed by a metal gate replacement process, or may be formed by another process. Top surfaces of the first metal gate 904 and the second metal gate 942 may be substantially coplanar with a top surface of the lower dielectric layer 905.

Figure 9B:
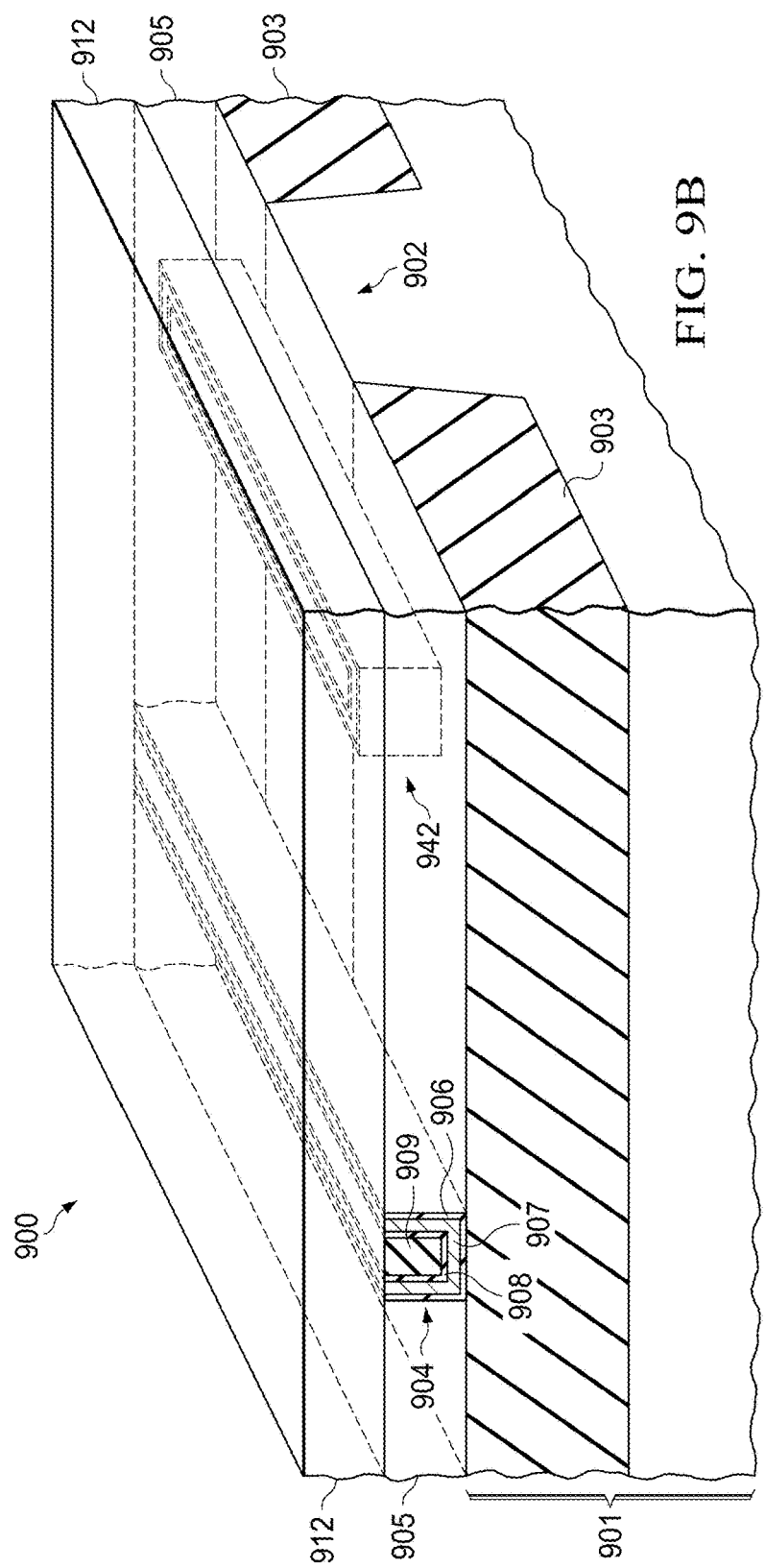

Referring to FIG. 9B, a lower PMD layer 912 is formed over the first metal gate 904, the second metal gate 942 and the lower dielectric layer 905. The lower PMD layer 912 may include, for example, an etch stop layer, a main dielectric layer over the etch stop layer, and a cap layer over the main dielectric layer. The etch stop layer may include silicon carbon nitride, silicon carbide, or silicon oxynitride. The main dielectric layer may include one or more layers of silicon dioxide or low-k dielectric material such as organosilicate glass (OSG), formed by PECVD processes. The cap layer may include silicon nitride or silicon oxynitride.

Figure 9C:
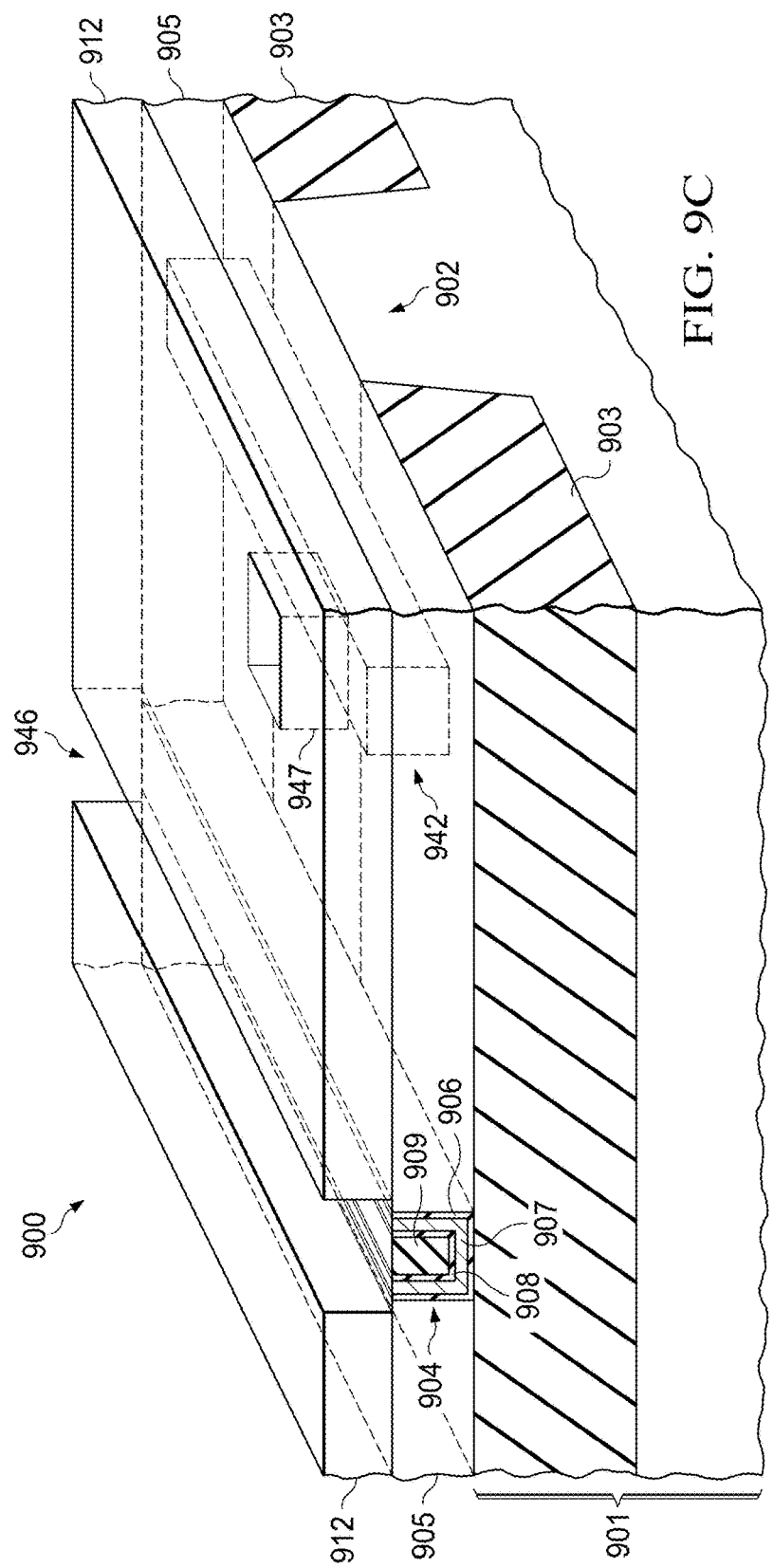

Referring to FIG. 9C, a trench 946 for a conductive spline and a contact hole 947 for a contact structure are formed in the lower PMD layer 912 so as to expose the first metal gate 904 and the second metal gate 942, respectively. The trench 946 exposes the first metal gate 904 along a length of the first metal gate 904 for at least four times a width of the first metal gate 904, and over at least a portion of the isolation dielectric layer 903. The trench 946 and the contact hole 947 may be formed concurrently or sequentially. The trench 946 and the contact hole 947 may be formed by a reactive ion etching (RIE) process.

Figure 9D:
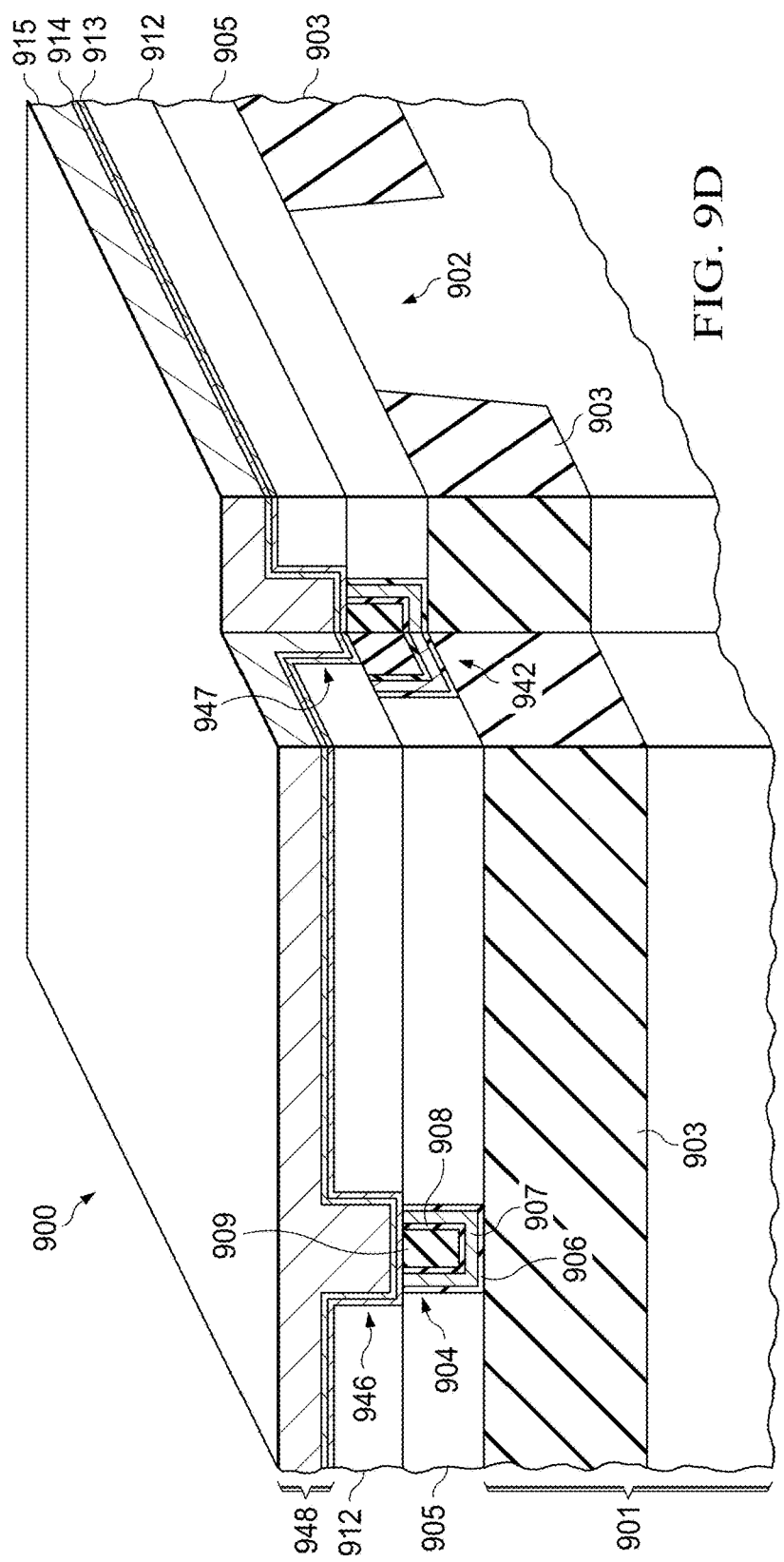

Referring to FIG. 9D, a metal layer stack 948 is formed over the lower PMD layer 912 and extending into the trench 946 and the contact hole 947 so as to make electrical connection to the first metal gate 904 and the second metal gate 942, respectively. The metal layer stack 948 may include, for example, an adhesion layer 913 of 5 nanometers to 15 nanometers of titanium which contacts the first metal gate 904 and the second metal gate 942, a barrier layer 914 of 10 nanometers to 20 nanometers of titanium nitride, formed on the adhesion layer 913, and a fill metal 915 of tungsten, aluminum, cobalt-aluminum alloy or copper, formed on the barrier layer 914. The metal layer stack 948 fills the trench 946 and the contact hole 947.

Figure 9E:
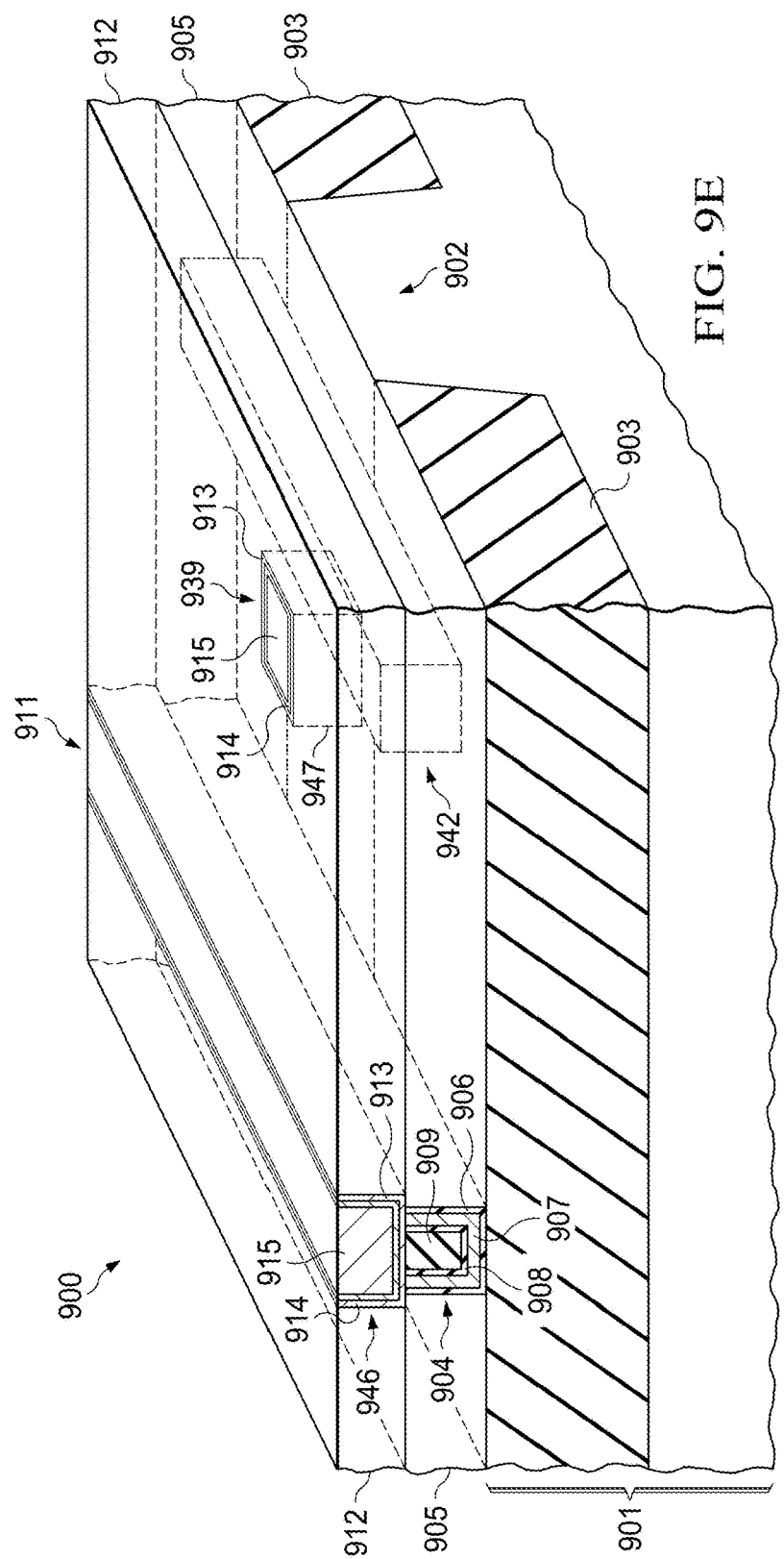

Referring to FIG. 9E, the fill metal 915, the barrier layer 914 and the adhesion layer 913 are removed from over a top surface of the lower PMD layer 912 using etchback and/or chemical mechanical polish (CMP) processes to form a conductive spline 911 on the first metal gate 904 in the trench 946, and a contact structure 939 on the second metal gate 942 in the contact hole 947. The conductive spline 911 and the contact structure 939 have a same layer structure. Forming the conductive spline 911 concurrently with the contact structure 939 as described in the instant example may advantageously reduce fabrication complexity and cost of the integrated circuit 900. Additional levels of the conductive spline 911 and the contact structure 939 may be formed, either concurrently or separately.

Figure 10A:
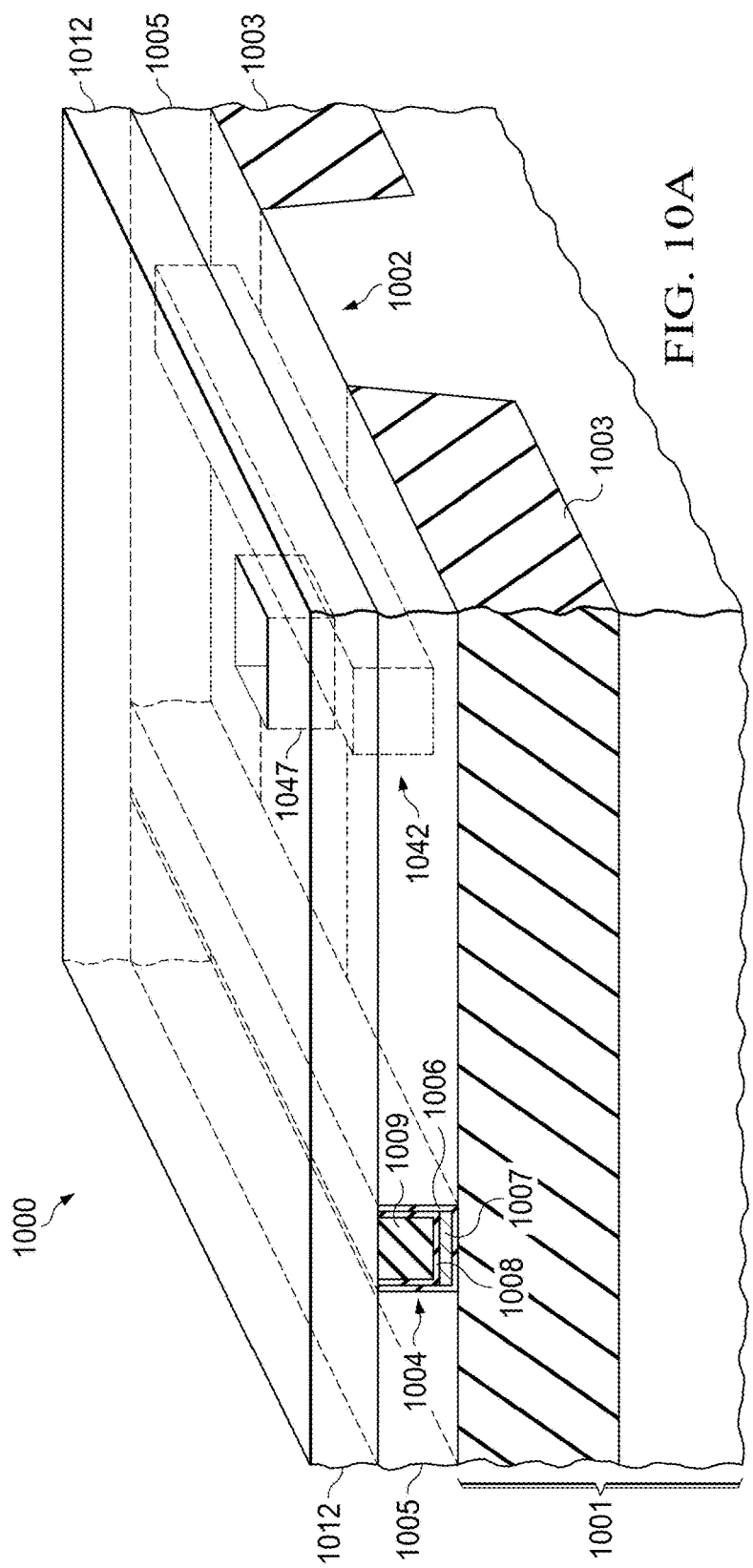
FIG. 10A through FIG. 10D are cross sections of another exemplary integrated circuit, depicted in successive stages of fabrication.

FIG. 10A through FIG. 10D are cross sections of another exemplary integrated circuit, depicted in successive stages of fabrication. Referring to FIG. 10A, the integrated circuit 1000 is formed on a substrate 1001, for example as described in reference to FIG. 1. An active area 1002 at a top surface of the substrate 1001 is bounded by an isolation dielectric layer 1003. A lower dielectric layer 1005 is formed over the substrate 1001, for example as described in reference to FIG. 9A.

A first metal gate 1004 and a second metal gate 1042 are formed on the substrate 1001 through the lower dielectric layer 1005. The first metal gate 1004 and the second metal gate 1042 may include, for example, a high-k gate dielectric layer 1006, a work function layer 1007 formed on the high-k gate dielectric layer 1006, a barrier layer 1008 formed on the work function layer 1007, and a fill metal 1009 formed on the barrier layer 1008. Other configurations of the first metal gate 1004 and the second metal gate 1042 are within the scope of the instant example.

A lower PMD layer 1012 is formed over the first metal gate 1004, the second metal gate 1042 and the lower dielectric layer 1005, for example as described in reference to FIG. 9B. A contact hole 1047 for a contact structure is formed in the lower PMD layer 1012 so as to expose the second metal gate 1042.

Figure 10B:
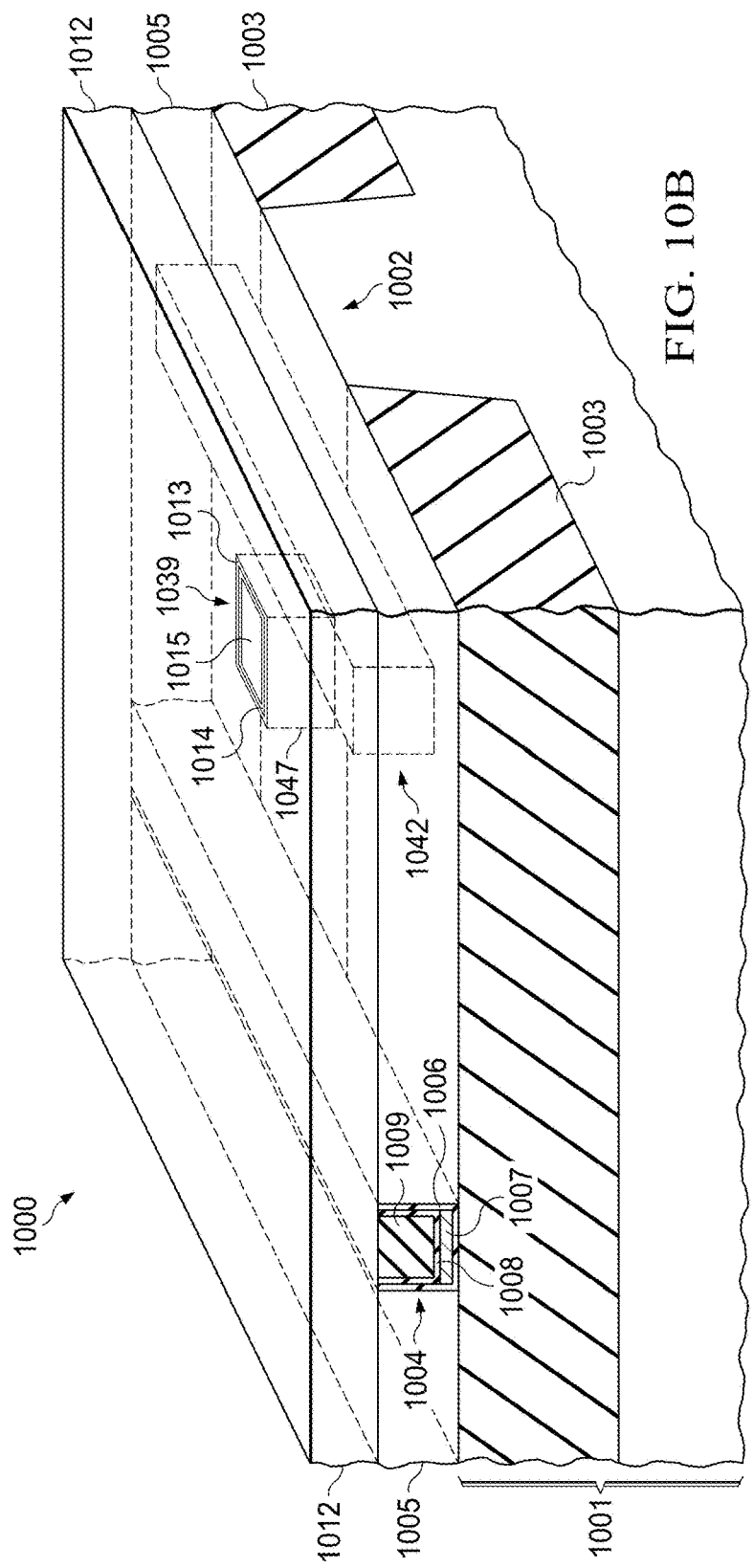

Referring to FIG. 10B, a contact structure 1039 is formed on the second metal gate 1042 in the contact hole 1047, for example as described in reference to FIG. 9D and FIG. 9E. The contact structure 1039 may include an adhesion layer 1013 which contacts the second metal gate 1042, a barrier layer 1014 formed on the adhesion layer 1013, and a fill metal 1015 formed on the barrier layer 1014. The metals and thicknesses of the contact structure 1039 may be selected to provide a desired electrical conductivity in a vertical direction through the contact structure 1039 to the second metal gate 1042.

Figure 10C:
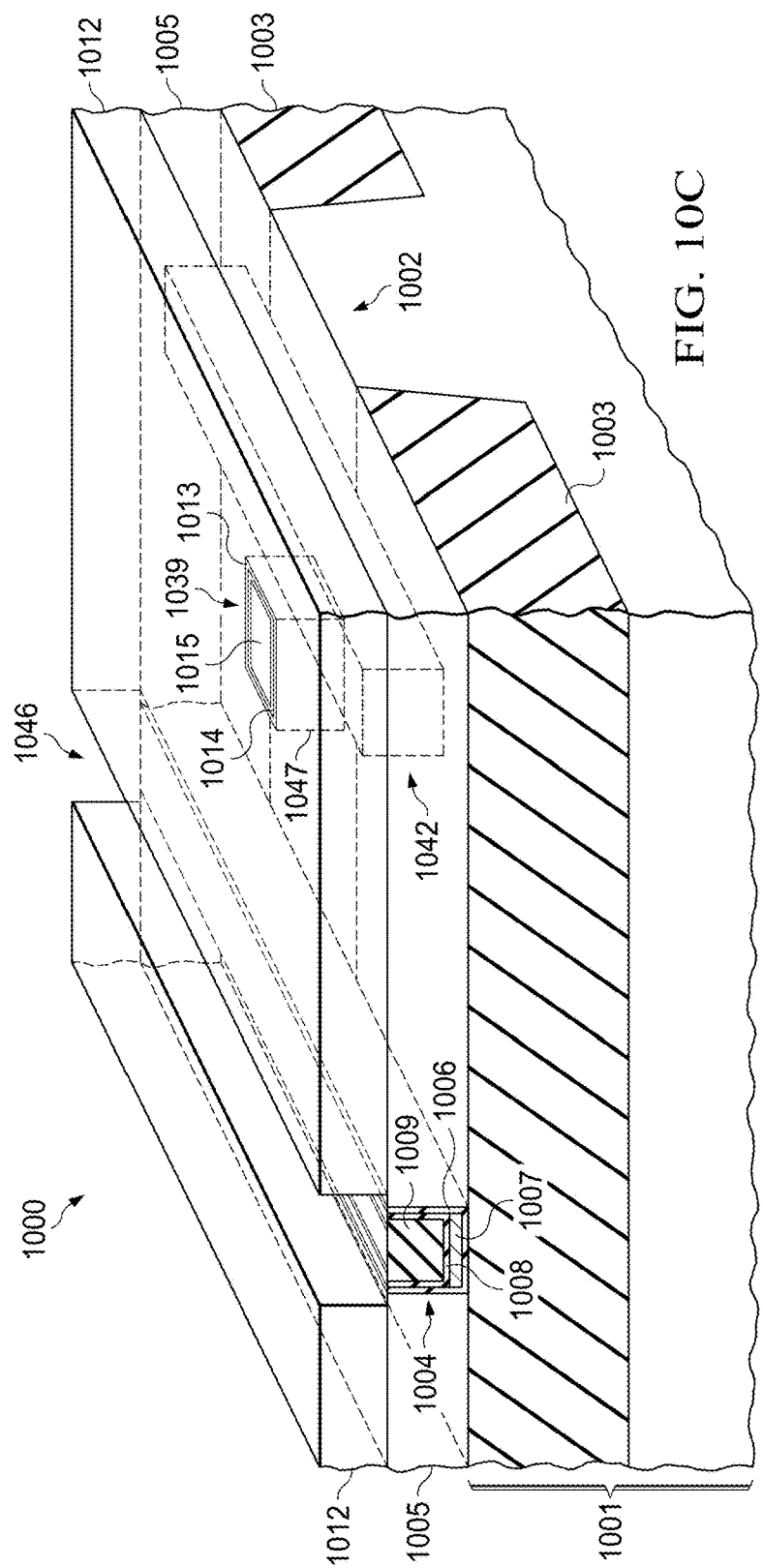

Referring to FIG. 10C, a trench 1046 for a conductive spline is formed in the lower PMD layer 1012 so as to expose the first metal gate 1004. The trench 1046 exposes the first metal gate 1004 along a length of the first metal gate 1004 for at least four times a width of the first metal gate 1004, and over at least a portion of the isolation dielectric layer 1003.

Figure 10D:
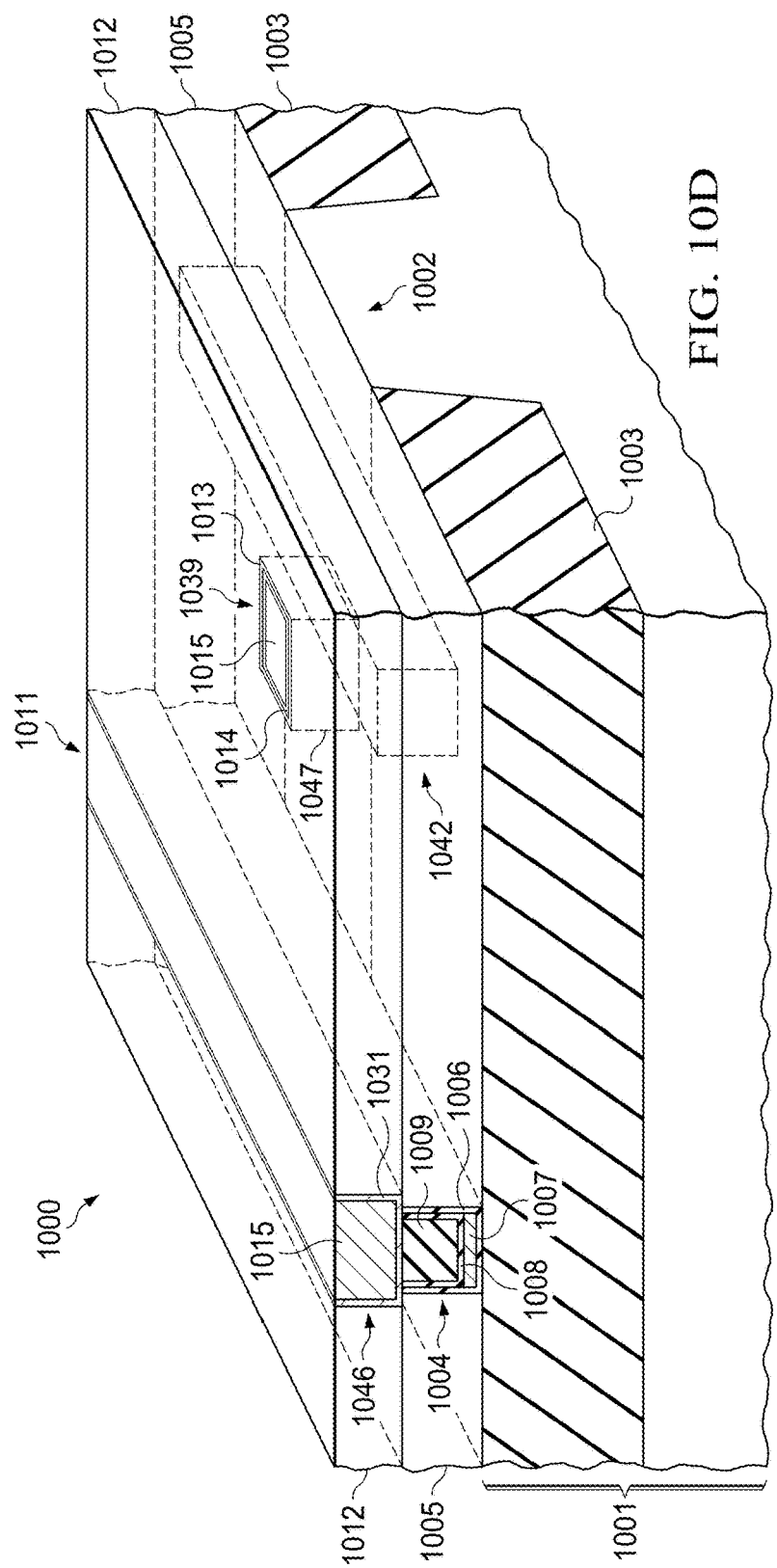

Referring to FIG. 10D, a conductive spline 1011 on the first metal gate 1004 is formed in the trench 1046, for example as described in reference to FIG. 9D and FIG. 9E. The conductive spline 1011 may include an adhesion layer 1031 of titanium alloy and a fill metal 1015 of aluminum or cobalt-aluminum alloy formed on the adhesion layer 1031. The conductive spline 1011 has a different layer structure from the contact structure 1039. The metals and thicknesses of the conductive spline 1011 may be selected to provide a desired electrical conductivity in a lateral direction along the first metal gate 1004. Forming the conductive spline 1011 separately from the contact structure 1039 may advantageously enable tailoring the materials and thicknesses in the conductive spline 1011 and the contact structure 1039 to provide desired electrical conductivity values exceeding those possible for a conductive spline and a contact structure formed concurrently.

Figure 11:
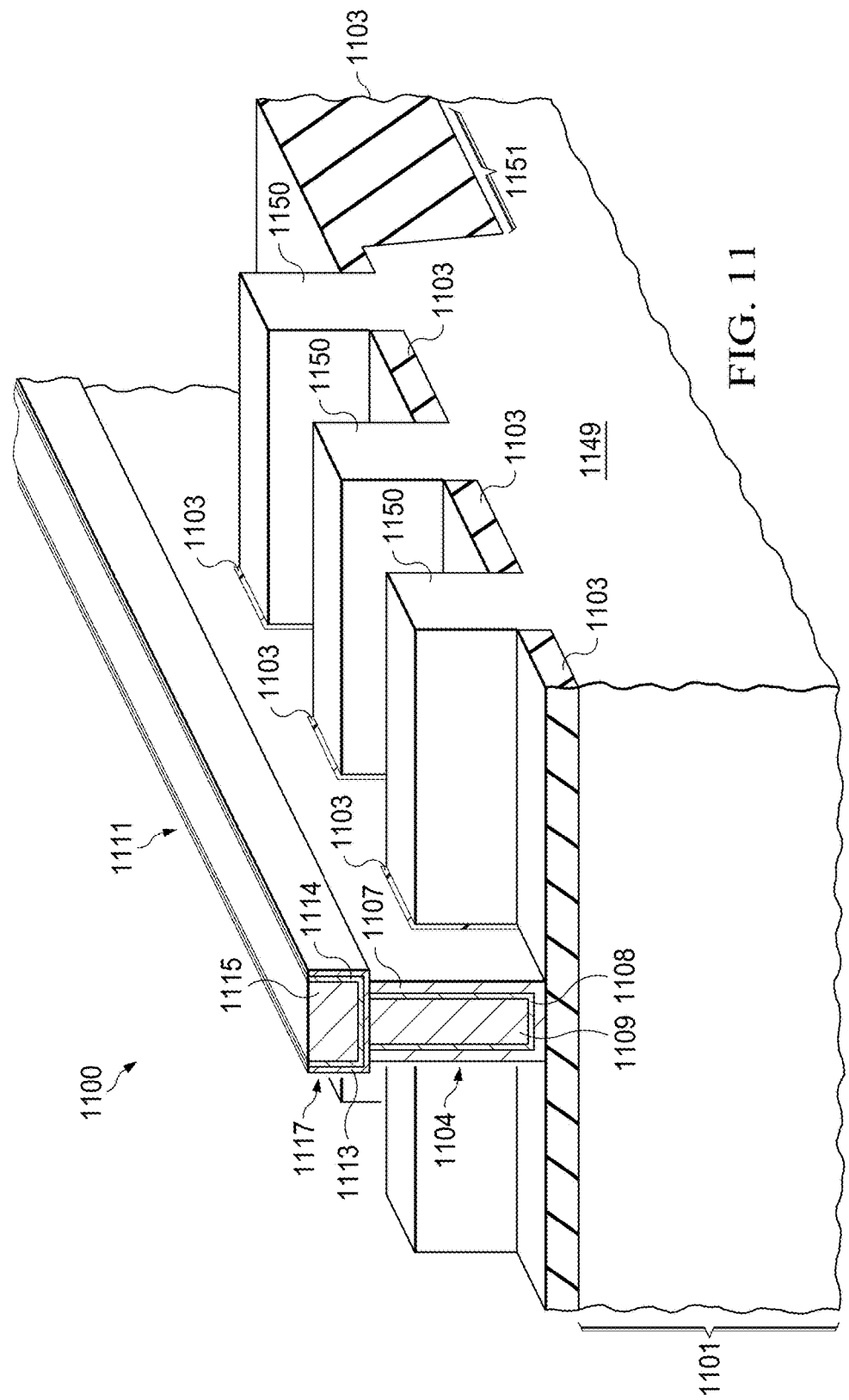
FIG. 11 is a cross section of an exemplary integrated circuit containing fin field effect transistors (finFETs).

FIG. 11 is a cross section of an exemplary integrated circuit containing fin field effect transistors (finFETs). The integrated circuit 1100 is formed on a substrate 1101 which includes semiconductor material 1149 in a top region. Fins 1150 are formed in the semiconductor material 1149. A dielectric isolation layer 1103 is formed on the substrate 1101. The dielectric isolation layer 1103 may include silicon dioxide in a segment of field oxide 1151 and may extend between the fins 1150 as depicted in FIG. 11. A gate dielectric layer 1106 is formed on the fins 1150, extending over at least a portion of the dielectric isolation layer 1103 in the field oxide 1151. A metal gate 1104 is formed over the gate dielectric layer 1106 and the fins 1150, possibly extending down to the dielectric isolation layer 1103. The metal gate 1104 may include, for example, a work function layer 1107, a barrier layer 1108 formed on the work function layer 1107, and a fill metal 1109 formed on the barrier layer 1108.

A conductive spline 1111 is formed on the metal gate 1104, extending on the metal gate 1104 over at least a portion of the isolation dielectric layer 1103 in the field oxide 1151 and extending on the metal gate 1104 for a length at least four times a width of the metal gate 1104. The conductive spline 1111 includes a first spline level 1117, which may include adhesion layer 1113 which contacts the metal gate 1104, a barrier layer 1114 formed on the adhesion layer 1113, and a fill metal 1115 formed on the barrier layer 1114. The conductive spline 1111 may include additional spline levels as described in reference to FIG. 2 and/or FIG. 3. Dielectric layers around the metal gate 1104 and the conductive spline 1111 have been omitted in FIG. 11 so as to more clearly show the spatial relationship of the conductive spline 1111 to the metal gate 1104. Forming the conductive spline 1111 on the metal gate 1104 of finFET transistors accrues the advantages discussed in reference to the other examples described herein.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:
1. A semiconductor device, comprising:
a substrate having a surface;
an isolation structure positioned near the surface of the substrate;
a metal gate structure over the surface of the substrate and across at least a portion of the isolation structure; and a conductive spline extending on the metal gate structure, over at least the portion of the isolation structure, and for a length at least four times of a width of the metal gate structure.

2. The semiconductor device of claim 1, wherein:
the isolation structure extends along a first direction;
the metal gate structure extends along a second direction deviating from the first direction, the width of the metal gate structure extends perpendicular to the second direction; and
the conductive spline extends for the length at least four times of the width of the metal gate structure along the second direction.

3. The semiconductor device of claim 1, wherein the conductive spline includes a first conductive spline level on the metal gate structure, and a second conductive spline level on the first conductive spline level.

4. The semiconductor device of claim 1, further comprising:
first active region in the substrate and near the surface of the substrate; and
second active region in the substrate and near the surface of the substrate, the second active region separated from the first active region by the isolation structure,
wherein the metal gate structure extends across a first junction between the first active region and the isolation structure, and across a second junction between the second active region and the isolation structure, and
wherein the conductive spline extends on the metal gate structure over the first junction and the second junction.

5. The semiconductor device of claim 1, wherein the conductive spline includes:
an adhesion layer on the metal gate structure;
a barrier layer on the adhesion layer; and
a metal layer on the barrier layer.

6. The semiconductor device of claim 5, wherein:
the adhesion layer includes a titanium layer;
the barrier layer includes a titanium nitride layer; and
the metal layer includes a material selected from a group consisting of tungsten, aluminum, cobalt-aluminum allow, copper, and a combinations thereof.

7. The semiconductor device of claim 1, wherein the metal gate structure includes:
a gate dielectric layer over the surface of the substrate and across at least the portion of the isolation structure;
a work function layer on the gate dielectric layer;
a barrier layer on the work function layer; and
a metal layer on the barrier layer.

8. The semiconductor device of claim 1, further comprising:
a contact structure extending above the surface of the substrate and positioned adjacent to the metal gate structure,
wherein the conductive spline is discontinued adjacent to the contact structure.

9. The semiconductor device of claim 1, further comprising:
an interconnect layer extending above the conductive spline and across the metal gate structure,
wherein the conductive spline is discontinued under the interconnect layer.

10. The semiconductor device of claim 1, further comprising:
an interconnect layer extending above and connected to the conductive spline.

11. A semiconductor device, comprising:
a substrate having a surface;
an isolation structure extending along a first direction near the surface of the substrate;
a metal gate structure extending along a second direction deviating from the first direction, and over the surface of the substrate and across at least a portion of the isolation structure; and
a conductive spline extending on the metal gate structure along the second direction.

12. The semiconductor device of claim 11, wherein:
the metal gate structure includes a width perpendicular to the second direction; and
the conductive spline extends for a length at least four times of the width of the metal gate structure along the second direction.

13. The semiconductor device of claim 11, wherein the conductive spline includes a first conductive spline level on the metal gate structure, and a second conductive spline level on the first conductive spline level.

14. The semiconductor device of claim 11, wherein the conductive spline includes:
an adhesion layer on the metal gate structure;
a barrier layer on the adhesion layer; and
a metal layer on the barrier layer.

15. The semiconductor device of claim 11, wherein the metal gate structure includes:
a gate dielectric layer over the surface of the substrate and across at least the portion of the isolation structure;
a work function layer on the gate dielectric layer;
a barrier layer on the work function layer; and
a metal layer on the barrier layer.

16. A semiconductor device, comprising:
a substrate having a surface;
isolation structures extending in parallel along a first direction near the surface of the substrate;
a metal gate structure extending along a second direction deviating from the first direction, and over the surface of the substrate and across the isolation structures;
fins extending along the first direction from the metal gate structure, the fins interleaving with the isolation structures and protruding above the surface of the substrate; and
a conductive spline extending on the metal gate structure along the second direction.

17. The semiconductor device of claim 16, wherein:
the metal gate structure includes a width perpendicular to the second direction; and
the conductive spline extends for a length at least four times of the width of the metal gate structure along the second direction.

18. The semiconductor device of claim 16, wherein the conductive spline includes a first conductive spline level on the metal gate structure, and a second conductive spline level on the first conductive spline level.

19. The semiconductor device of claim 16, wherein the conductive spline includes:
an adhesion layer on the metal gate structure;
a barrier layer on the adhesion layer; and
a metal layer on the barrier layer.

20. The semiconductor device of claim 16, wherein the metal gate structure includes:
a gate dielectric layer over the surface of the substrate and across the isolation structures;
a work function layer on the gate dielectric layer;
a barrier layer on the work function layer; and
a metal layer on the barrier layer.

* * * * *